US007132307B2

(12) United States Patent
Wang et al.

(10) Patent No.: US 7,132,307 B2
(45) Date of Patent: Nov. 7, 2006

(54) HIGH PERFORMANCE SILICON CONDENSER MICROPHONE WITH PERFORATED SINGLE CRYSTAL SILICON BACKPLATE

(75) Inventors: Zhe Wang, Singapore (SG); Qingxin Zhang, Singapore (SG); Hanhua Feng, Singapore (SG)

(73) Assignee: Knowles Electronics, LLC., Itasca, IL (US)

( * ) Notice: Subject to any disclaimer, the term of this patent is extended or adjusted under 35 U.S.C. 154(b) by 174 days.

(21) Appl. No.: 10/736,377

(22) Filed: Dec. 15, 2003

(65) Prior Publication Data

US 2004/0179705 A1 Sep. 16, 2004

Related U.S. Application Data

(62) Division of application No. 10/243,906, filed on Sep. 13, 2002, now Pat. No. 6,667,189.

(51) Int. Cl.
*H01L 21/00* (2006.01)
*H04R 25/00* (2006.01)

(52) U.S. Cl. ........................................ 438/53; 381/191

(58) Field of Classification Search ................ 381/150, 381/168, 174, 191
See application file for complete search history.

(56) References Cited

U.S. PATENT DOCUMENTS

| | | | | |
|---|---|---|---|---|
| 4,993,072 | A * | 2/1991 | Murphy | 381/113 |
| 5,146,435 | A * | 9/1992 | Bernstein | 367/181 |
| 5,452,268 | A * | 9/1995 | Bernstein | 367/181 |
| 5,490,220 | A * | 2/1996 | Loeppert | 381/355 |
| 5,677,965 | A * | 10/1997 | Moret et al. | 381/191 |
| 5,870,482 | A * | 2/1999 | Loeppert et al. | 381/174 |
| 6,088,463 | A * | 7/2000 | Rombach et al. | 381/174 |
| 6,667,189 | B1 | 12/2003 | Wang et al. | |
| 2002/0067633 | A1* | 6/2002 | Ito et al. | 365/94 |

* cited by examiner

*Primary Examiner*—David S. Blum
(74) *Attorney, Agent, or Firm*—Marshall, Gerstein & Borun LLP

(57) ABSTRACT

A silicon condenser microphone is described. The silicon condenser microphone of the present invention comprises a perforated backplate comprising a portion of a single crystal silicon substrate, a support structure formed on the single crystal silicon substrate, and a floating silicon diaphragm supported at its edge by the support structure and lying parallel to the perforated backplate and separated from the perforated backplate by an air gap.

11 Claims, 13 Drawing Sheets

HIGH PERFORMANCE SILICON CONDENSER MICROPHONE WITH PERFORATED SINGLE CRYSTAL SILICON BACKPLATE

BACKGROUND OF THE INVENTION (1) Field of the Invention

The invention relates to a method of manufacturing a silicon condenser microphone, and more particularly, to a method of manufacturing a high performance silicon condenser microphone using a silicon micro-machining process.

(2) Description of the Prior Art

Silicon condenser microphones have long been an attractive research and development subject. Various microphone designs have been invented and conceptualized by using silicon micro-machining technology. Despite various structural configurations and materials, the silicon condenser microphone consists of four basic elements: a movable compliant diaphragm, a rigid and fixed backplate (which together form a variable air gap capacitor), a voltage bias source, and a pre-amplifier. These four elements fundamentally determine the performance of the condenser microphone. In pursuit of high performance; i.e., high sensitivity, low bias, low noise, and wide frequency range, the key design considerations are to have a large size of diaphragm and a large air gap. The former will help increase sensitivity as well as lower electrical noise, and the later will help reduce acoustic noise of the microphone. However, the large diaphragm requires a large span of anchored supports and correspondingly a large backplate. Also, a large air gap requires a thick sacrificial layer. These present major difficulties in/silicon micro-machining processes. Due to constraints of material choices and intrinsic stress issues in silicon micro-machining, the silicon microphones reported so far have not achieved sensitivity of more than 20 mV/Pa.

Miniaturized silicon microphones have been extensively developed for over sixteen years, since the first silicon piezoelectric microphone reported by Royer in 1983. In 1984, Hohm reported the first silicon electret-type microphone, made with a metallized polymer diaphragm and silicon backplate. And two years later, he reported the first silicon condenser microphone made entirely by silicon micro-machining technology. Since then a number of researchers have developed and published reports on miniaturized silicon condenser microphones of various structures and performance.

Some of these reports include the following:

1) D. Hohm and R. Gerhard-Multhaupt, "Silicon-dioxide electret transducer", J. Acoust. Soc. Am., Vol. 75, 1984, pp. 1297–1298.

2). D. Hohm and G. Hess, "A Subminiature condenser microphone with silicon nitride membrane and silicon backplate", J. Acoust. Soc. Am., Vol. 85, 1989, pp. 476–480.

3) Murphy, P. et al., "Subminiature silicon integrated electret capacitor microphone", IEEE Trans. Electr. Ins., Vol. 24, 1989, pp. 495–498.

4) Bergqvist, J. et al., "A new condenser microphone in silicon", Sensors and Actuators, Vol. A21–23, 1990, pp. 123–125.

5) Kuhnel, W. et al., "A Silicon condenser microphone with structured backplate and silicon nitride membrane," Sensors and Actuators, Vol. 30, 1991, pp. 251–258.

6) Scheeper, P. R. et al., "Fabrication of silicon condenser microphones using single wafer technology", Journal of Microelectromechanical Systems, Vol. 1, No. 3, 1992, pp. 147–154.

7) Scheeper, P. R. et al., "A Review of Silicon Microphones", Sensors and Actuators A, Vol. 44, Jul. 1994, pp. 1–11.

8) Bergqvist, J. et al., "A Silicon Microphone using bond and etch-back technology", Sensors and Actuators A, vol. 45, 1994, pp. 115–124.

9) Zou, Quanbo et al., "Theoretical and experimental studies of single-chip-processed miniature silicon condenser microphone with corrugated diaphragm", Sensors and Actuators A, Vol. 63, 1997, pp. 209–215.

10) Brauer, M. et al., "Silicon microphone based on surface and bulk micromachining", Journal of Micromech. Microeng., Vol. 11, 2001, pp 319–322.

11) Bergqvist, J. and V. Rudolf, "A silicon condenser microphone with a highly perforated backplate", Transducer 91, pp. 266–269.

U.S. Pat. No. 5,870,482 to Loeppert et al reveals a silicon microphone. U.S. Pat. No. 5,490,220 to Loeppert shows a condenser and microphone device. U.S. Patent Application Publication 2002/0067663 to Loeppert et al shows a miniature acoustic transducer. U.S. Pat. No. 6,088,463 to Rombach et al teaches a silicon condenser microphone process. U.S. Pat. No. 5,677,965 to Moret et al shows a capacitive transducer. U.S. Pat. Nos. 5,146,435 and 5,452,268 to Bernstein disclose acoustic transducers. U.S. Pat. No. 4,993,072 to Murphy reveals a shielded electret transducer.

However, none of the silicon condenser microphones mentioned above has been reported to achieve sensitivity above 20 mV/Pa. In terms of conventional condenser microphones (i.e. non-silicon), very few products can have sensitivity as high as 100 mV/Pa. For example, Bruel & Kjoer, Denmark (B&K) has only one microphone available with this high sensitivity (B&K 4179, 1-inch diameter). Its dynamic range is about 140 dB (200 Pa) and frequency range is 5–7 kHz. However, this microphone must be fit onto a bulky pre-amplifier and requires a polarization voltage of 200 V.

SUMMARY OF THE INVENTION

A principal object of the present invention is to provide an effective and very manufacturable method of fabricating a silicon condenser microphone having high sensitivity and low noise.

Another object of the invention is to provide a silicon condenser microphone design having high sensitivity and low noise.

A further object of the invention is to provide a method for fabricating a silicon condenser microphone using via contact processes for a planar process.

Yet another object of the invention is to provide a method for fabricating a silicon condenser microphone using buckling of a composite diaphragm to prevent stiction in a wet release process.

In accordance with the objects of this invention a silicon condenser microphone is achieved. The silicon condenser microphone of the present invention comprises a perforated backplate comprising a portion of a single crystal silicon substrate, a support structure formed on the single crystal silicon substrate, and a floating, silicon diaphragm supported at its edge by the support structure and lying parallel to the perforated backplate and separated from the perforated backplate by an air gap.

Also in accordance with the objects of this invention a method of fabricating a silicon condenser microphone having high sensitivity and low noise is achieved. A single crystal silicon substrate (P−) is provided. First ions (P+) of a first conductivity type are implanted into the single crystal silicon substrate to form a pattern of acoustic holes in a central portion of the substrate. Second ions (N−) of a second conductivity type opposite the first conductivity type are implanted into the substrate and surrounding the pattern of acoustic holes to form a backplate region. Third ions (P+) of the first conductivity type are implanted overlying the pattern of acoustic holes. Fourth ions (N+) of the second conductivity type are implanted overlying a portion of the backplate region not surrounding the pattern of acoustic holes to form an ohmic contact region. A front side nitride layer is deposited overlying the backplate region. A back side nitride layer is deposited on an opposite surface of the substrate. A front side sacrificial oxide layer is deposited overlying the front side nitride layer. A back side sacrificial oxide layer is deposited overlying the back side nitride layer. First trenches are etched through the front side sacrificial oxide layer to the ohmic contacts, and to the substrate off the backplate region. The first trenches are filled with a first polysilicon layer which is patterned to form polysilicon caps overlying the first trenches and to form polysilicon endplates surrounding the pattern of acoustic holes. A first oxide layer is deposited overlying the patterned first polysilicon layer. The first oxide layer is etched to the polysilicon layer followed by a thin oxide deposition to form the tiny holes for first dimples overlying the endplates. A second polysilicon layer is deposited overlying the first oxide layer and filling the first dimple holes. The second polysilicon layer is etched to form a functional layer of a composite diaphragm and its lead-out to a bond pad. A second oxide layer is deposited overlying the first oxide layer and the functional diaphragm. A narrow and continuous opening on the second oxide layer is etched on an inner edge of the functional diaphragm. A third polysilicon layer is deposited overlying the second oxide layer and filling the openings whereby a portion of the second oxide layer is enclosed between the second and third polysilicon layers to form a compressive layer of the composite diaphragm. The third polysilicon layer is patterned to remain filling the narrow and continuous opening to form a protective layer over the compressive layer of the composite diaphragm. The first and second oxide layers are etched followed by a thin oxide deposition to form second dimple holes overlying the first dimples. A deep oxide trench etching is made through the endplates and the sacrificial oxide layer to the substrate to form the supporting struts. The first and second oxide layers are etched to make anchor openings to the polysilicon caps, endplates, and bond pads. A nitride layer is deposited overlying the second oxide layer and filling the second dimple holes, the oxide trenches and the anchor openings. The nitride layer is patterned to expose the bond pads and the composite diaphragm within the second dimples. Thereafter, the backside sacrificial oxide layer is removed and the backside-nitride layer is patterned. From the backside, the silicon substrate is etched away to the backplate region. The pattern of acoustic holes is selectively etched away. The backside nitride layer and the frontside nitride layer exposed by the acoustic holes are etched away from the backside. The frontside sacrificial oxide layer is removed using a wet etching method wherein the compressive layer of the composite diaphragm causes the composite diaphragm to buckle in a direction away from the backplate region. After drying, the protective layer and the compressive layer of the composite diaphragm are removed wherein the functional diaphragm flattens to complete fabrication of a silicon condenser microphone.

BRIEF DESCRIPTION OF THE DRAWINGS

In the accompanying drawings forming a material part of this description, there is shown.

DESCRIPTION OF THE PREFERRED EMBODIMENTS

Figure 1:
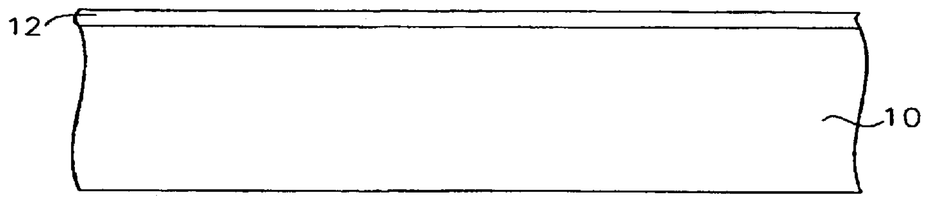
FIGS. 1 through 20 schematically illustrate in cross-sectional representation a preferred embodiment of the present invention.

The present invention discloses a novel design and process for making a silicon condenser microphone. Referring now more particularly to FIG. 1, there is shown a semiconductor substrate 10, preferably composed of P-doped monocrystalline silicon. A thermal oxide layer 12 is grown on the surface of the substrate to a thickness of between about 270 and 330 Angstroms.

Figure 2:
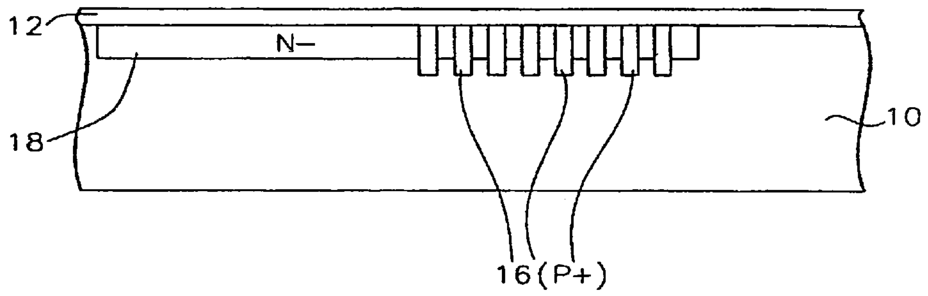

Referring now to FIG. 2, P+ implants 16 are made through a mask, not shown. These implanted regions 16 will form acoustic holes on the backplate in the later selective silicon etching process. The P+ implant condition must ensure the acoustic hole size at a desired backplate thickness. Now, an N− implanted region 18 is formed using a second mask, not shown. The N− implant condition must ensure a low stress backplate so that the backplate will not deform after the release process at the end of the fabrication process. The implanted ions are driven in to a depth of about 10 microns, which is the depth of the N− region. Because of the dosage difference, the P+ region has a larger drive-in depth.

Figure 3:
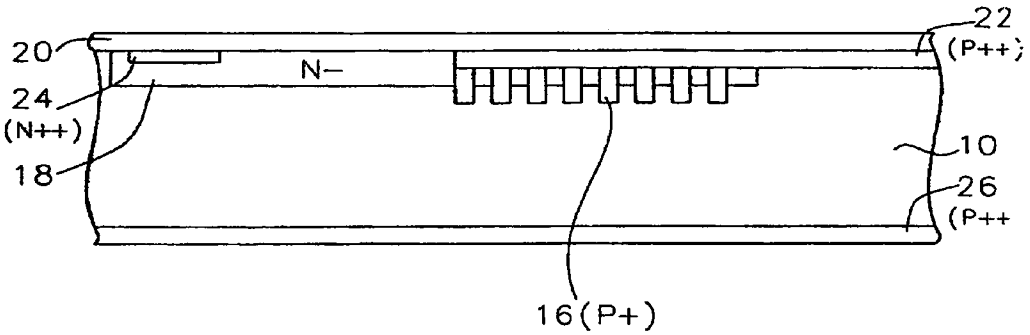

The thermal oxide layer 12 is removed, for example, by wet etching. Now a second thermal oxide layer 20 is grown on the surface of the substrate to a thickness of between about 270 and 330 Angstroms, as illustrated in FIG. 3. A P++ implantation region 22 is formed at the surface of the substrate using a PMOS source/drain implant condition. A N++ implantation region 24 is formed elsewhere at the surface of the substrate using an NMOS source/drain implant condition. A backside P++ implantation region 26 is formed on the backside of the wafer using a PMOS source/drain implant condition. Now, a shallow drive-in source/drain annealing is performed and the thermal oxide layer 20 is removed.

Figure 4:
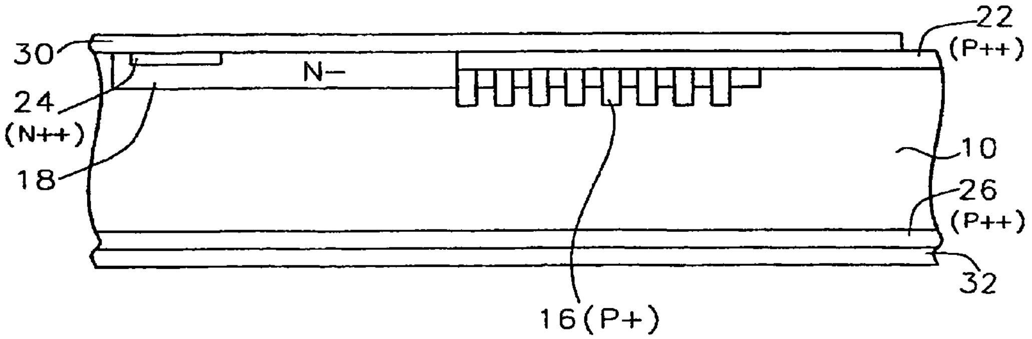

Referring now to FIG. 4, a composite dielectric layer is formed on front and back sides of the wafer. First a thermal oxide layer is grown on the front and back sides (illustrated as top and bottom of the drawing figure) to a thickness of between about 270 and 330 Angstroms. Next, a silicon nitride layer is deposited by low pressure chemical vapor deposition (LPCVD) over the thermal oxide layer on the front and back sides of the wafer to a thickness of between about 1400 and 1600 Angstroms. The composite oxide/nitride layer 30 is patterned to expose the P++ contact on the wafer edge. The composite oxide/nitride layer will act as an etching stop on the frontside and as a silicon etching mask on the backside.

Now, a tetraethoxysilane (TEOS) oxide layer is deposited over the composite oxide/nitride layer on both the front and back sides of the wafer by LPCVD to a thickness of between about 1800 and 2200 Angstroms. Finally, a second nitride layer is deposited over the TEOS layer only on the back side of the wafer by plasma enhanced chemical vapor deposition (PECVD). This will provide an excellent mask for silicon etching by KOH on the backside of the wafer. The composite layer of thermal oxide, nitride, and TEOS oxide on the top side of the wafer is represented by 30 in FIG. 4. The composite layer of thermal oxide, nitride, TEOS oxide, and PECVD nitride on the back side of the wafer is represented by 32.

Figure 5:
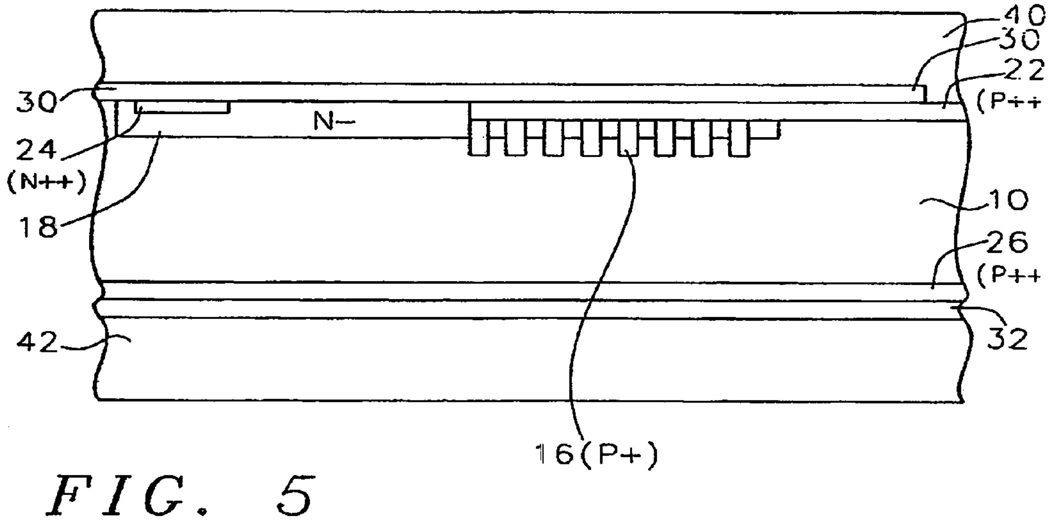

Now, sacrificial oxide layers are deposited on the front and back sides of the wafer as shown in FIG. 5. The oxide layer on the back side of the wafer provides stress balance. Sacrificial oxide layers 40 and 42 may be formed in successive steps. For example, a first layer of phosphosilicate glass (PSG) is deposited on the front side of the wafer to a thickness of about 3 microns, followed by a TEOS oxide layer deposited by PECVD to a thickness of about 1 micron. Next, a 3 micron layer of PSG and a successive 1 micron layer of PE-TEOS is deposited on the back side of the wafer. Then, a 2 μm layer of PSG is deposited on the PE-TEOS layer on the front side of the wafer, followed by 1 μm of PE-TEOS and 1 μm of PSG. This completes the front side sacrificial oxide layer 40. The backside sacrificial oxide layer 42 may be completed in the same way by depositing a 2 μm layer of PSG is deposited on the PE-TEOS layer on the back side of the wafer, followed by 1 μm of PE-TEOS and 1 μm of PSG. Other combinations of steps and materials can be used. The wafer is annealed; for example, at between about 950 and 1150° C. for about 30 minutes. The annealing serves to densify the composite sacrificial oxide layer.

Figure 6:
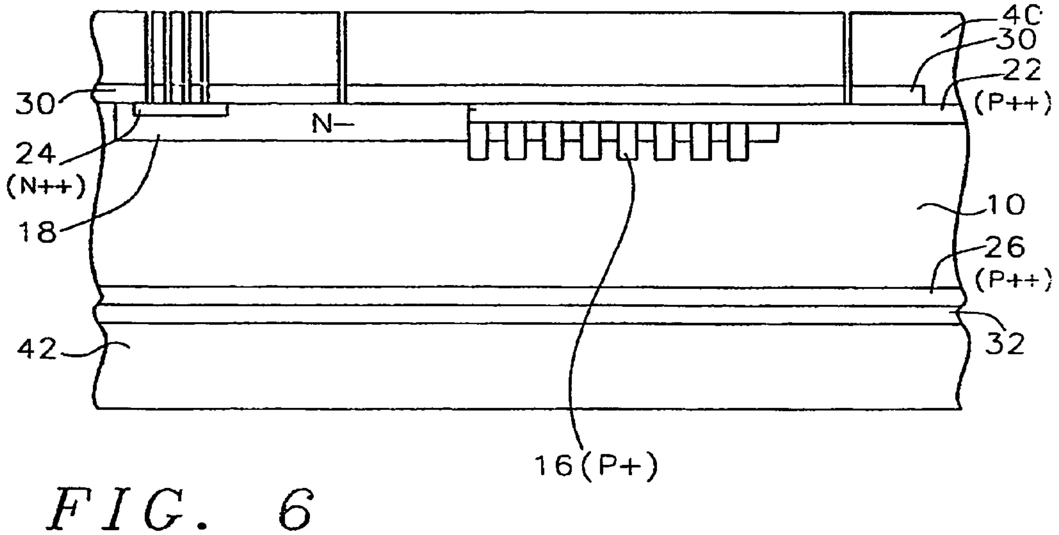

Referring now to FIG. 6, deep trenches are etched through the sacrificial oxide layer 40 and the composite dielectric layer 30 to the silicon substrate.

Figure 7:
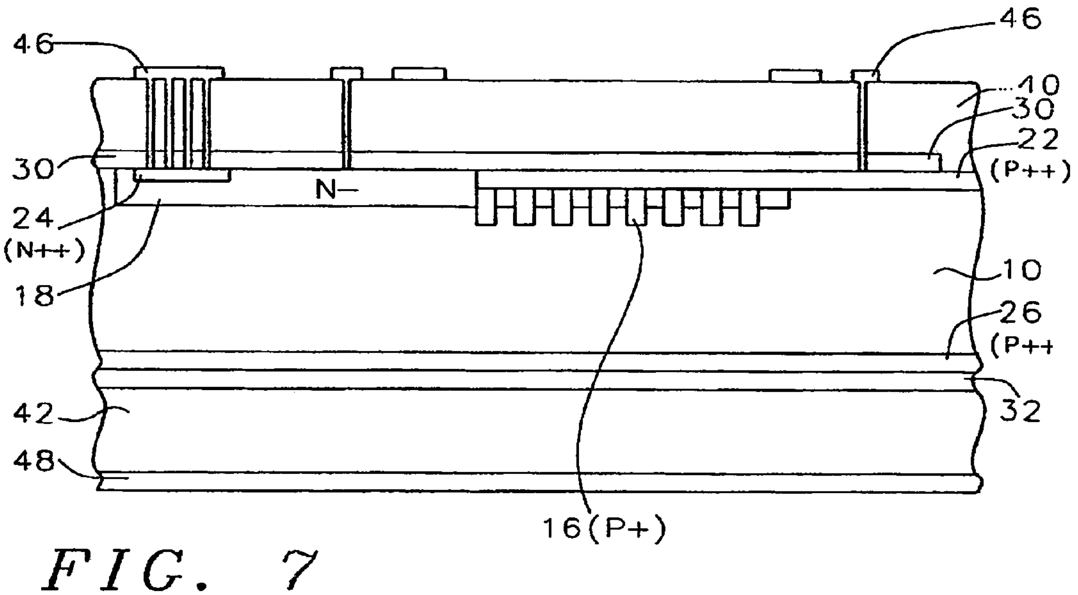

Now, a polysilicon layer 46 is deposited over the top oxide layer and within the trenches. Simultaneously, polysilicon 48 is deposited on the bottom oxide layer 42. The polysilicon layer is patterned to leave a polysilicon cap of about 1.5 μm in thickness over the filled trenches and elsewhere as shown in FIG. 7. The filled trenches provide via contacts to the N-type doped backplate as well as the isolation walls to protect the oxide outside the diaphragm area. The caps are formed to provide supports for the diaphragm. Now the wafer is annealed; for example, at between about 950 and 1150° C. for about 90 minutes. This annealing causes the polysilicon 46 to be doped by the phosphorous component in the PSG.

Figure 8:
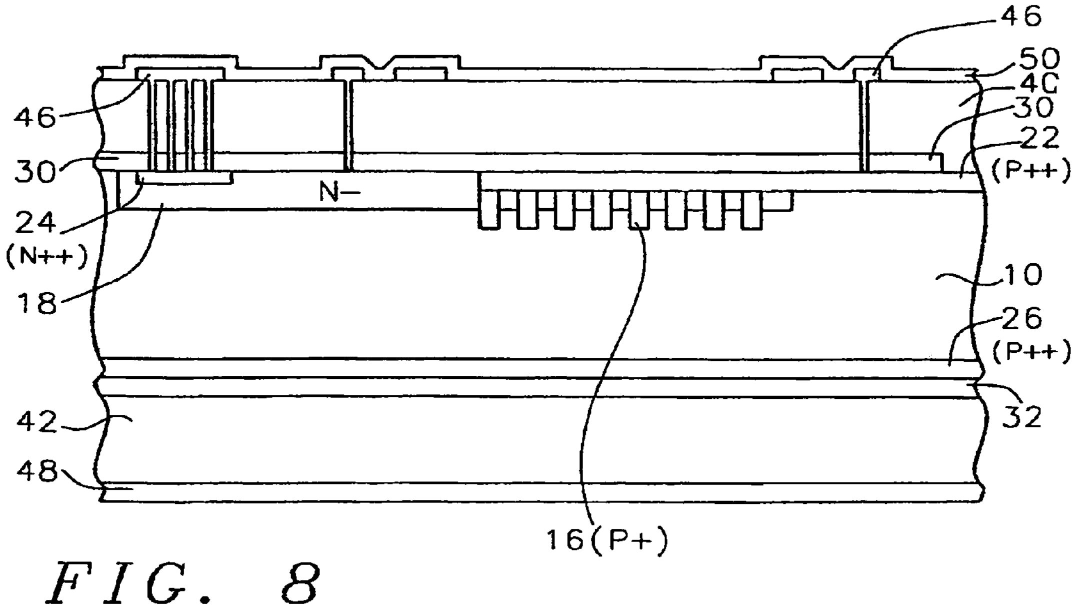
Figure 9:
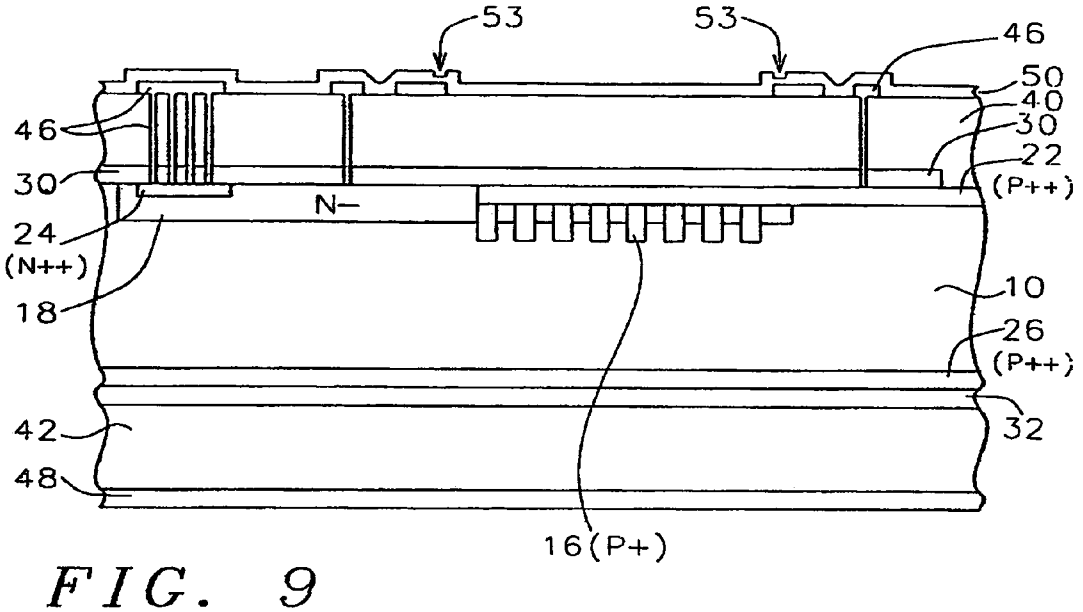

Now the diaphragm is to be formed. An oxide layer 50 is deposited over the patterned polysilicon layer, as shown in FIG. 8. For example, the oxide layer 50 may comprise a first layer of TEOS oxide deposited by LPCVD to a thickness of between about 900 and 1100 Angstroms and a second layer of PSG oxide having a thickness of between about 8100 and 9900 Angstroms. The LP-TEOS layer is necessary to prevent PSG from bubbling and serious reflow in later high temperature annealing steps. Other materials like PE-TEOS oxide may also be used. Now, the oxide layer 50 is etched to the polysilicon layer 46 above the acoustic holes 16. A thin oxide layer, not shown, is deposited conformally over the oxide layer 50 to a thickness of between about 900 and 1100 Angstroms and lining the holes etched to the polysilicon layer to form dimple holes 53. Oxide layer 50 includes this additional thin oxide layer in the drawing figures.

Figure 10:
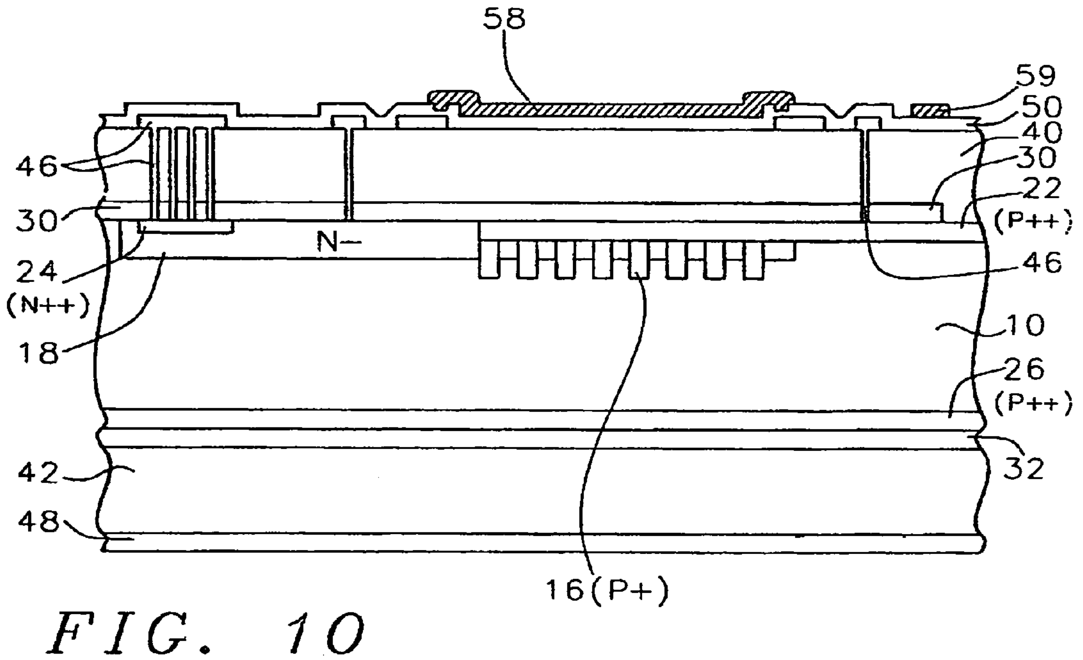

Now a layer of polysilicon 58 is deposited over the oxide layer 50 and filling the dimple holes to form the dimples 53, as shown in FIG. 10. The thickness of the polysilicon layer should be about 3 μm. The polysilicon layer 58 is patterned as shown. The section 59 is a lead-out to a bond pad.

Figure 11:
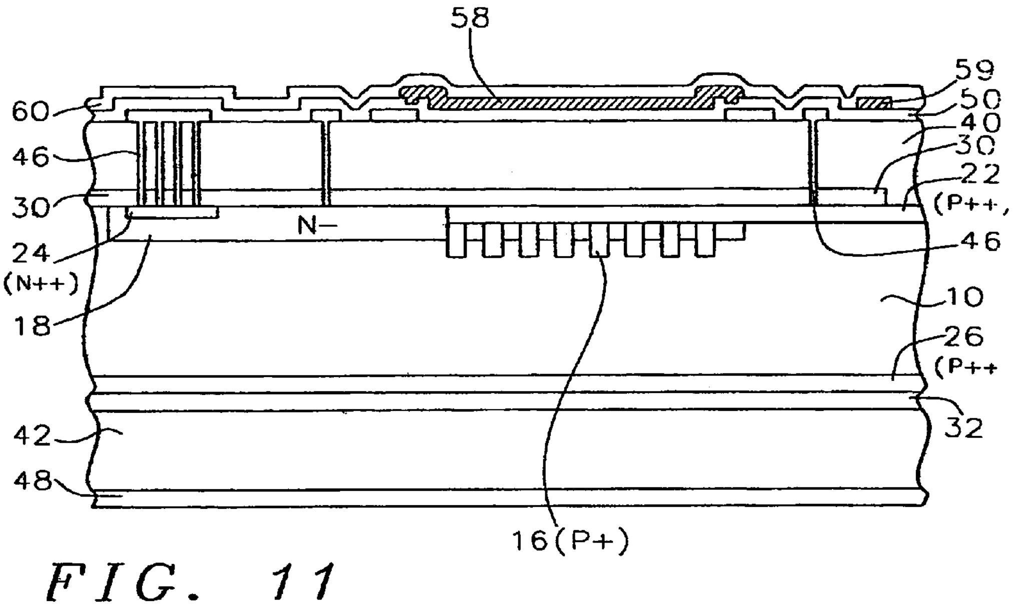
Figure 12:
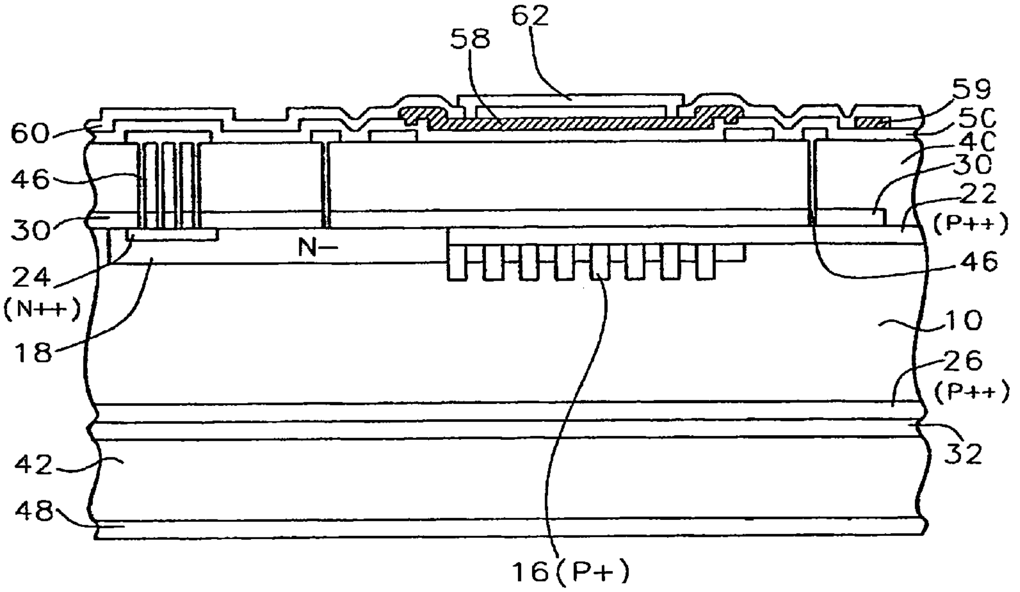

As illustrated in FIG. 11, a PSG layer 60 is deposited over the oxide layer 50 and the polysilicon layer 58 to a thickness of between about 4500 and 5500 Angstroms. A narrow and continuous opening is etched through the PSG layer 60 to the polysilicon layer 58. A polysilicon layer 62 is deposited over the PSG layer and filling the opening, as shown in FIG. 12. The polysilicon layer 62 has a thickness of between about 3500 and 4100 Angstroms. The polysilicon layer 62 encloses the PSG layer overlying the polysilicon layer 58.

Figure 13:
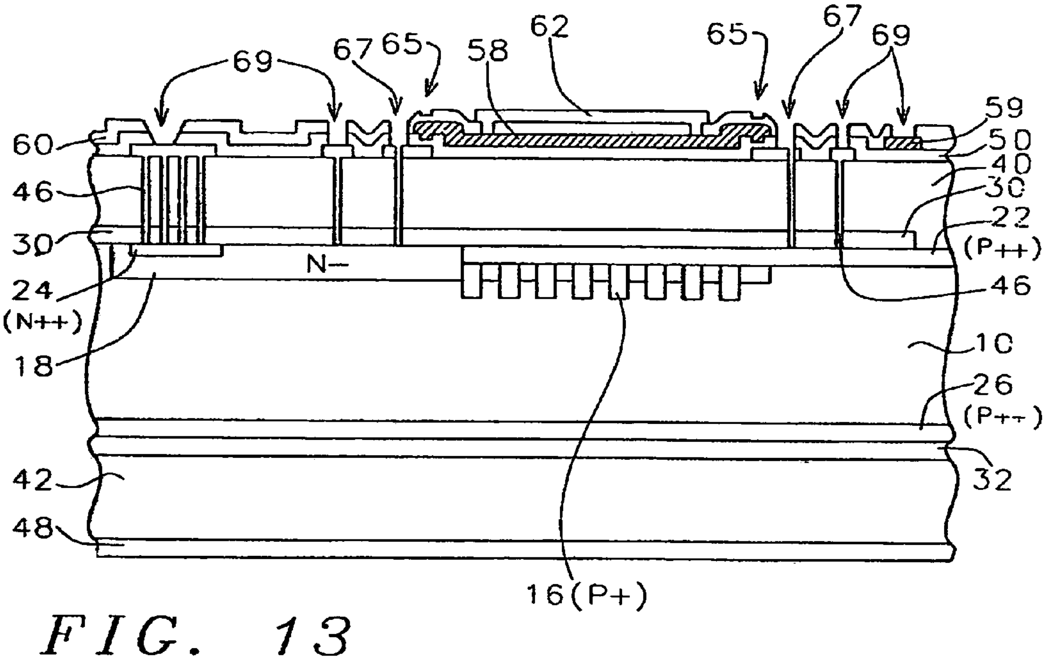

Referring now to FIG. 13, the oxide layer 60 is etched to form dimple holes 65 directly overlying the dimple holes 53 filled with the diaphragm layer 58. Another oxide layer is deposited over the oxide layer 60 and lining the dimple holes 65. This oxide layer is not shown apart from the oxide layer 60 in the drawings. Because of this oxide layer, the dimples do not contact the diaphragm layer 56. Deep trenches 67 are etched through the oxide layer 60, the polysilicon layer 46, and the oxide layer to the silicon substrate adjacent to but outside the edges of the diaphragm 58. Anchor openings 69 are also etched, preferably using a wet etching recipe, to the horizontal polysilicon structures 46 overlying the first deep trenches filled with polysilicon 46 and overlying the second deep trenches 67. A wet etching recipe is preferred so that a sloped opening is formed. The sloped opening will prevent sharp corners in a later nitride deposition.

Figure 14:
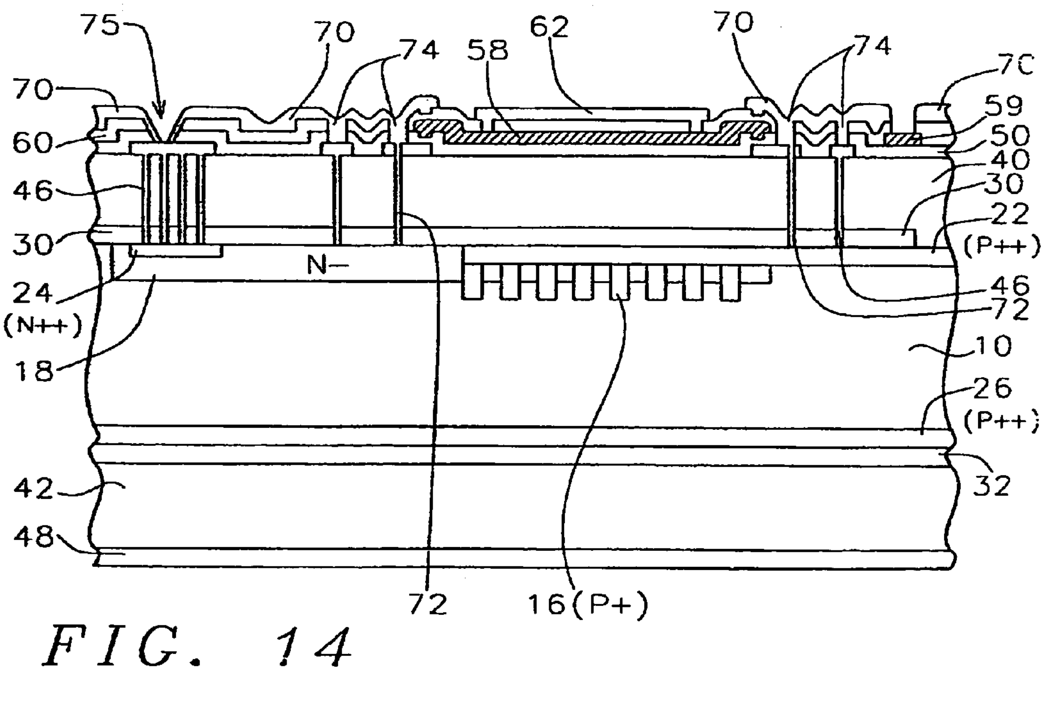

As illustrated in FIG. 14, a nitride layer 70 is deposited over the wafer and filling the dimple holes 65, trenches 67, and openings 69. The nitride layer is deposited by PECVD for low tensile stress to a thickness of about 3 μm. The nitride layer 72 within the deep trenches 67 forms supporting struts for the diaphragm. The nitride layer 74 within the anchor openings 69 forms anchors.

The nitride layer 70 is etched using, for example, a combination of dry and wet etching to form openings 75 to bonding pads 46 and 59 and to clear the nitride from the area of the diaphragm.

Figure 15:
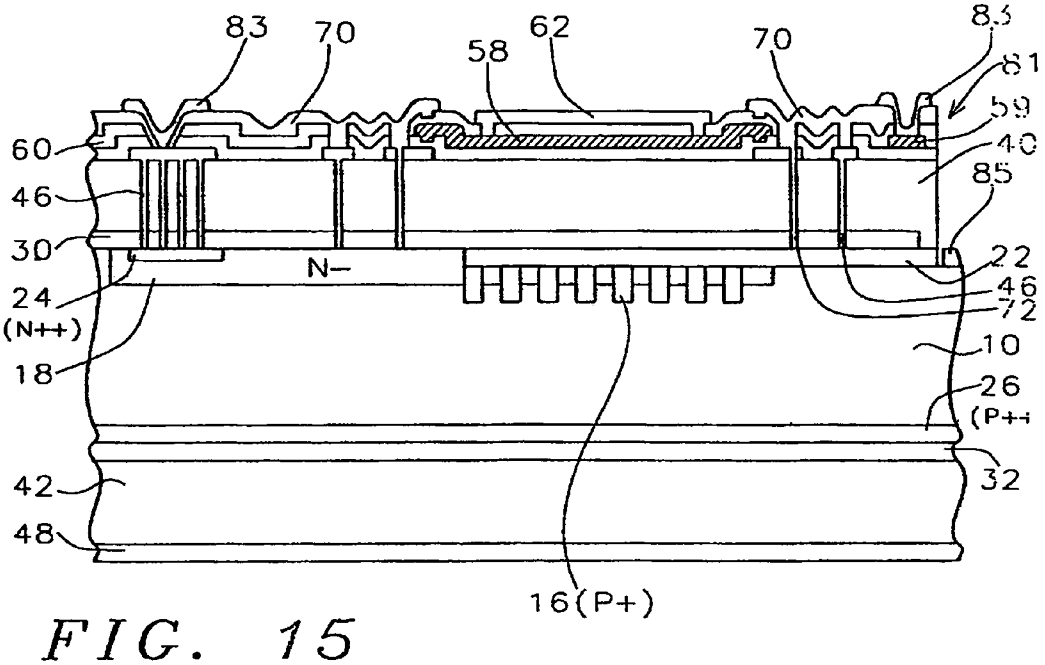

A contact 81 is opened by a dry and wet etching process to the substrate surface, as shown in FIG. 15. The etching is made on the wafer edge to open the contact to the P++ region which connects all P+ acoustic holes. A chromium layer is deposited over the substrate to a thickness of between about 700 and 900 Angstroms followed by a gold seed layer having a thickness of between about 2200 and 2600 Angstroms. Gold is electroplated selectively onto the seed layer to form bond pads 83 having a thickness of about 2 μm.

Figure 16:
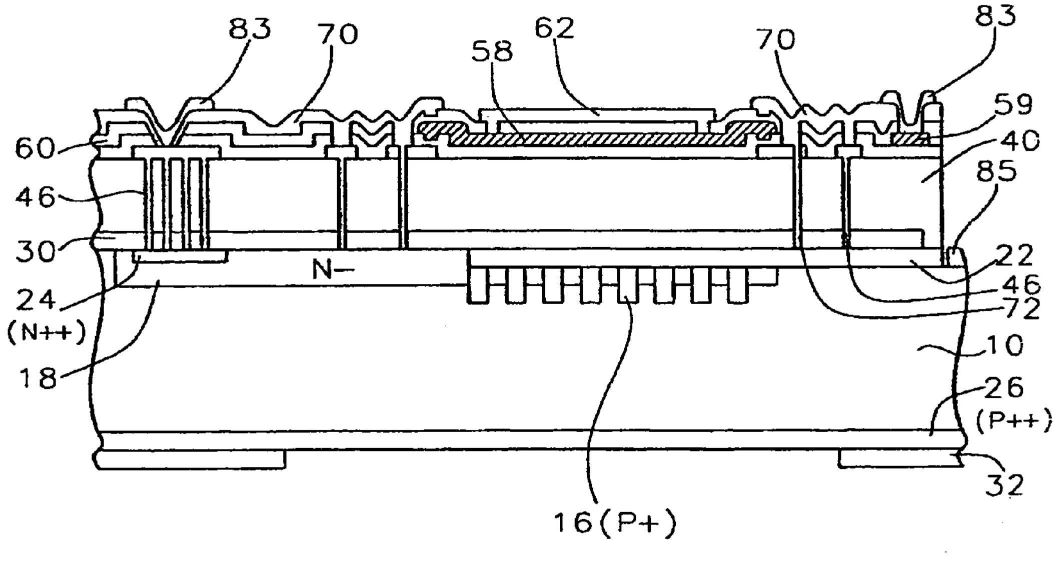

Referring now to FIG. 16, layers 48 and 42 are stripped from the backside of the wafer. Then, layer 32 is etched away where it is not covered by a mask, not shown, using a nitride etching recipe.

Figure 17:
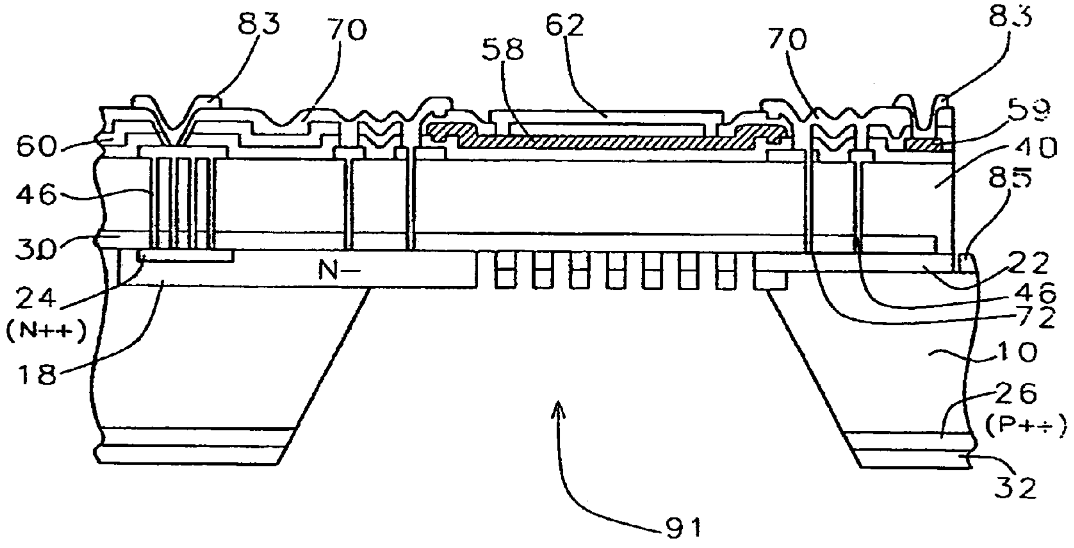

Now, a KOH etching is performed using the composite layer 32 as mask, to open the back side of the wafer as shown in FIG. 17. The etching is a selective etching of silicon using a four electrode electrochemical etching (ECE) configuration. The N− region contacts a positive electrode (working electrode) while the P+ acoustic hole region connects to a negative electrode (cathode). A negative electrode (counter-electrode) is inserted in the KOH solution. A reference electrode in the KOH solution provides the referential potential. By the four-electrode configuration, the N− region and the p-type substrate are inverse biased. The silicon is etched until the N− region is reached. The sudden increased current in the N− region causes oxide passivation to prevent N− from being etched. The etching continues at the P+ acoustic holes because of the reverse biasing. The potentials of all the electrodes are required to be controlled properly. This is the key to the ECE technique. Etching stops at the nitride in layer 30. Back side opening 91 is shown.

Figure 18:
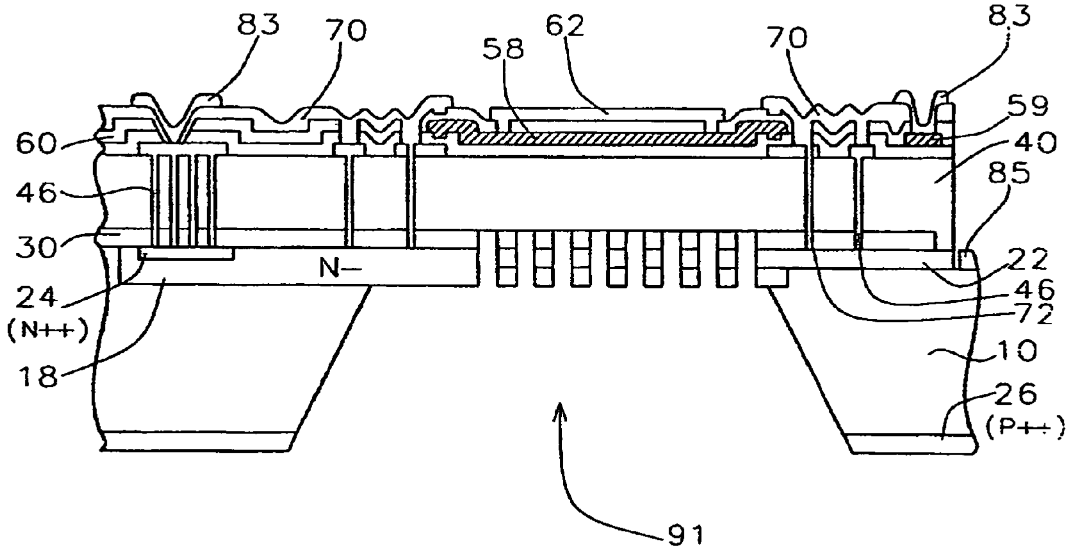

Cr/Au as the sputtered ECE metal layer is etched. 83 is plated by Au about 2 microns thick and so remains. A blanket nitride stripping from the back side of the wafer removes layer 32 completely and also strips nitride layer 30 where it is exposed by the acoustic holes, as illustrated in FIG. 18.

The wafer is now cut by a high speed spinning diamond cutter, called dicing. Now, the wafer is subjected to a dip in a hydrofluoric acid solution, preferably about 49% HF, for about 3.5 minutes. This dip removes the sacrificial oxide layer 40 through the backside opening as well as the frontside gaps, as shown in FIG. 19.

Figure 19:
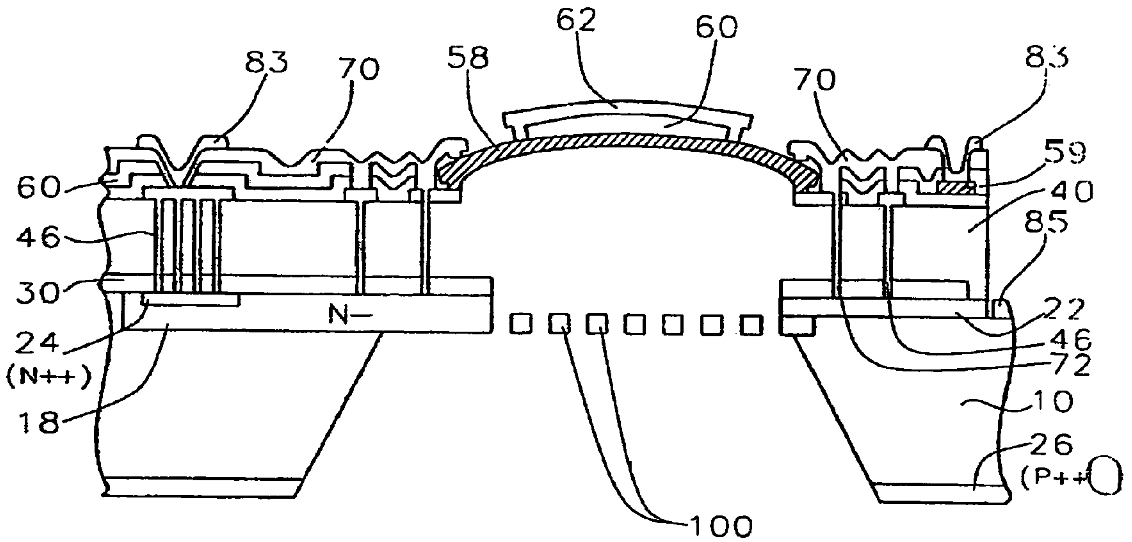

FIG. 19 shows compressive buckling of the diaphragm 58. The sandwiched compressive layer 60 causes buckling during the wet release step. This compressive buckling is desirable as it can counter the stiction force during drying and thus prevent the diaphragm from sticking to the back-plate 100. The device is rinsed and then dried. For example, rinsing is in de-ionized water for about 30 minutes and in methanol for 30 minutes. Drying is done in a oven at 90° C. The dimples formed in the dimple holes 53 are there to minimize the constraints to the diaphragm 58 for the desired simply-supported boundary condition. Dimples can touch either to the poly caps 46 or to the nitride top 70.

Now, the protective layer 62 and the compressive layer 60 of the composite diaphragm are removed. First the polysilicon layer 62 is removed by a dry etching. A second dry etching step removes the PSG oxide layer 60. No masking is required in these removal steps because either polysilicon etching or oxide etching does not attack the other exposed layers. The two dry etching process steps have high selectivity to each other.

Figure 20:
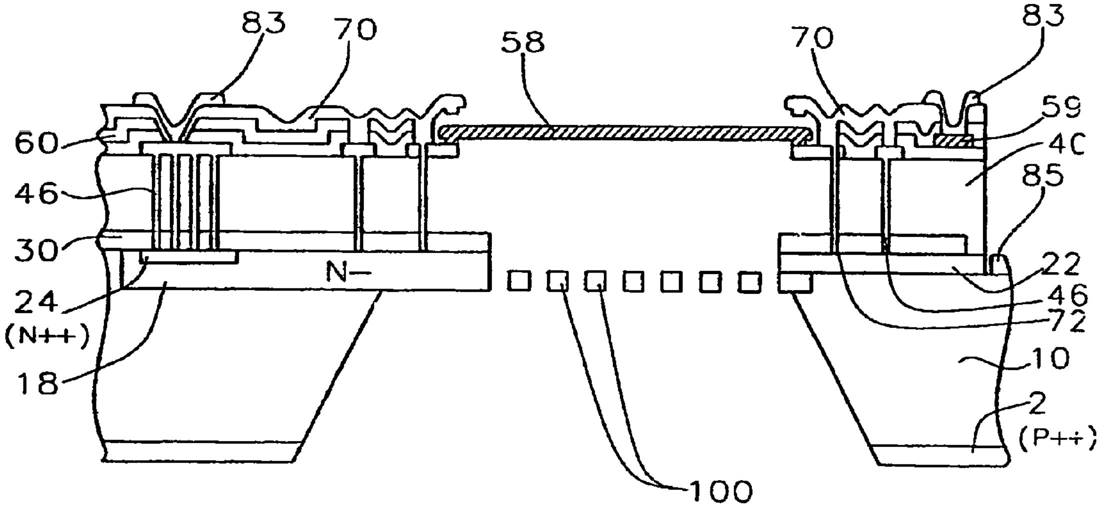

The completed microphone is shown in FIG. 20. After the compressive oxide is removed, the stress is released and the diaphragm flattened.

Figure 21:
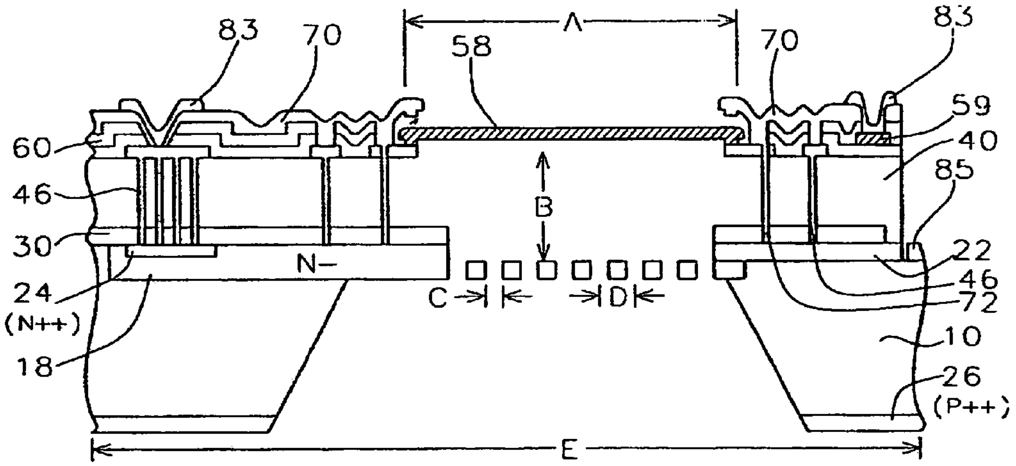
FIG. 21 schematically illustrates in cross-sectional representation a completed microphone of the present invention.

A number of design variations are proposed to cover the sensitivity from 25 mV/Pa to above 100 mV/Pa. FIG. 21 and Table I illustrate the microphone design parameters and Table II illustrates simulated performance parameters. In FIG. 21, the die size E is 3980 μm. E is variable and could be smaller for a smaller diaphragm, for example. Diaphragm size A, air gap B, acoustic hole size C, and acoustic hole pitch D are illustrated.

TABLE I

| | Design Variations | | | | |
|---|---|---|---|---|---|
| | 1 | 2 | 3 | 4 | 5 |
| Diaphragm size (μm) | 2000 | 1000 | 1000 | 2000 | 2000 |
| Diaphragm thickness (μm) | 3 | 2 | 2 | 2 | 2 |
| Air Gap (μm) | 8 | 8 | 8 | 8 | 8 |
| Backplate thickness (μm) | 10 | 10 | 10 | 10 | 10 |
| Acoustic hole (μm) | 20 | 30 | 40 | 40 | 40 |
| Acoustic hole pitch (μm) | 60 | 84 | 100 | 100 | 84 |
| # acous. holes | 850 | 95 | 75 | 300 | 425 |
| Acoustic perforation | 10.80% | 10.90% | 15.30% | 15.20% | 12.20% |

TABLE II

| | Design Variations | | | | |
|---|---|---|---|---|---|
| | 1 | 2 | 3 | 4 | 5 |
| Zero-bias capac. (pF) | 3.10 | 0.80 | 0.74 | 2.95 | 3.48 |
| Collapse voltage (V) | 15.6 | 33.41 | 34.89 | 16.69 | 15.74 |
| Bias volt. (V) | 10.4 | 22.27 | 23.27 | 10.69 | 10.49 |
| Sensitivity dB ref 1 V/Pa | −19.63 | −31.89 | −29.43 | −19.7 | −19.71 |
| Sensitivity mV/Pa | 104 | 25 | 34 | 103 | 103 |
| Low roll-off (Hz) | 3 | <3 | <3 | 4 | 4 |
| High roll-off (Hz) | 3600 | 10,000 | 9000 | 6500 | 6600 |
| Over pressure (Pa) | 52 | 247 | 252 | 52 | 52 |

Table I illustrates design parameter variations that have been reduced to practice for 5 sample dies. Table II illustrates the simulation results for the 5 sample dies. Important results are the bias voltage (=⅔ of the collapse voltage) and Sensitivity in mV/Pa. Over pressure is shown where deflection is less than ⅔ of the gap height. The design parameters of design variations 1, 4, and 5 enable high sensitivities above 100 mV/Pa while those of design variations 2 and 3 give lower sensitivities (33 mV/Pa) but a wider frequency response.

Figure 22:
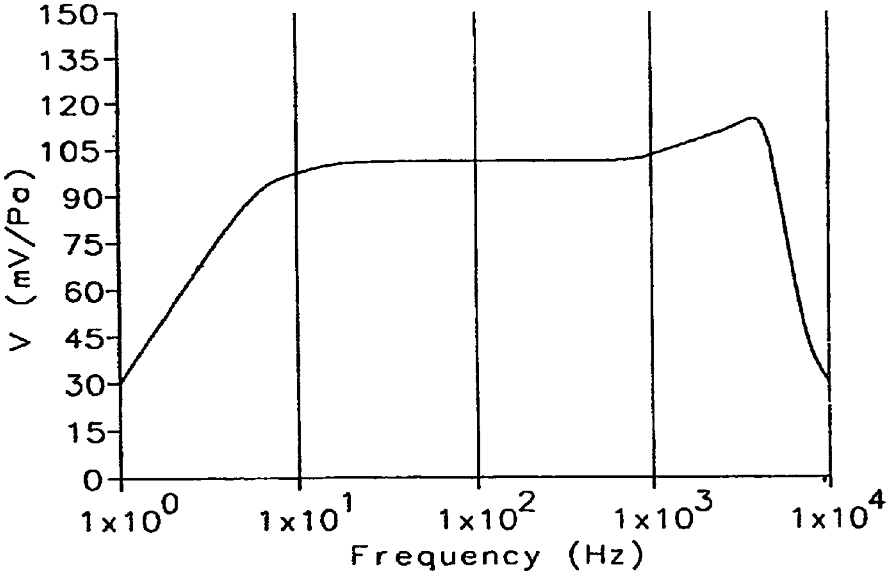
FIG. 22 graphically illustrates a typical simulated frequency response for a microphone of the present invention.
Figure 23:
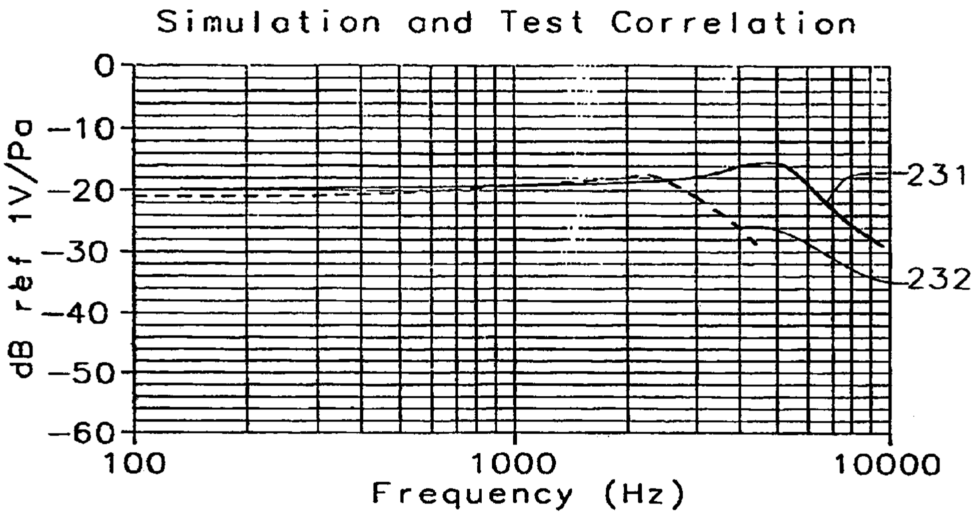
FIG. 23 graphically illustrates simulated and tested frequency responses for a microphone of the present invention.
Figure 24:
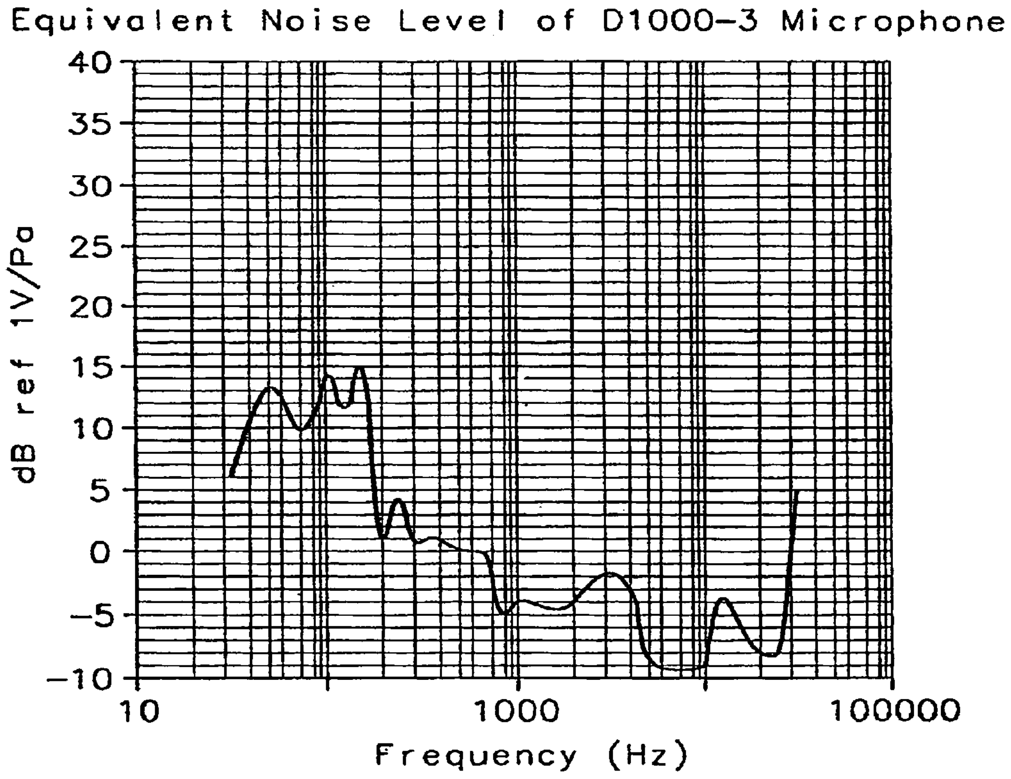
FIG. 24 graphically illustrates the tested equivalent noise level for a microphone of the present invention.

FIG. 22 illustrates a typical frequency response for design variation number 4 with a bias voltage of 10.7 volts. The present invention has been reduced to practice. FIG. 23 provides a simulation and test correlation at a bias voltage of 10 volts. Line 231 shows the simulated results for a microphone of the present invention. Line 232 shows the actual tested frequency response of a microphone fabricated according to the process of the present invention. FIG. 24 illustrates the tested equivalent noise level of a microphone fabricated according to the process of the present invention at a bias voltage of 10 volts. The equivalent noise level (ENL) is equal to the microphone self-noise divided by the microphone sensitivity. The ENL decides the minimum sound pressure level that can be detected by the microphone. The tested ENL in FIG. 24 was 9.4 dBA.

Figure 25:
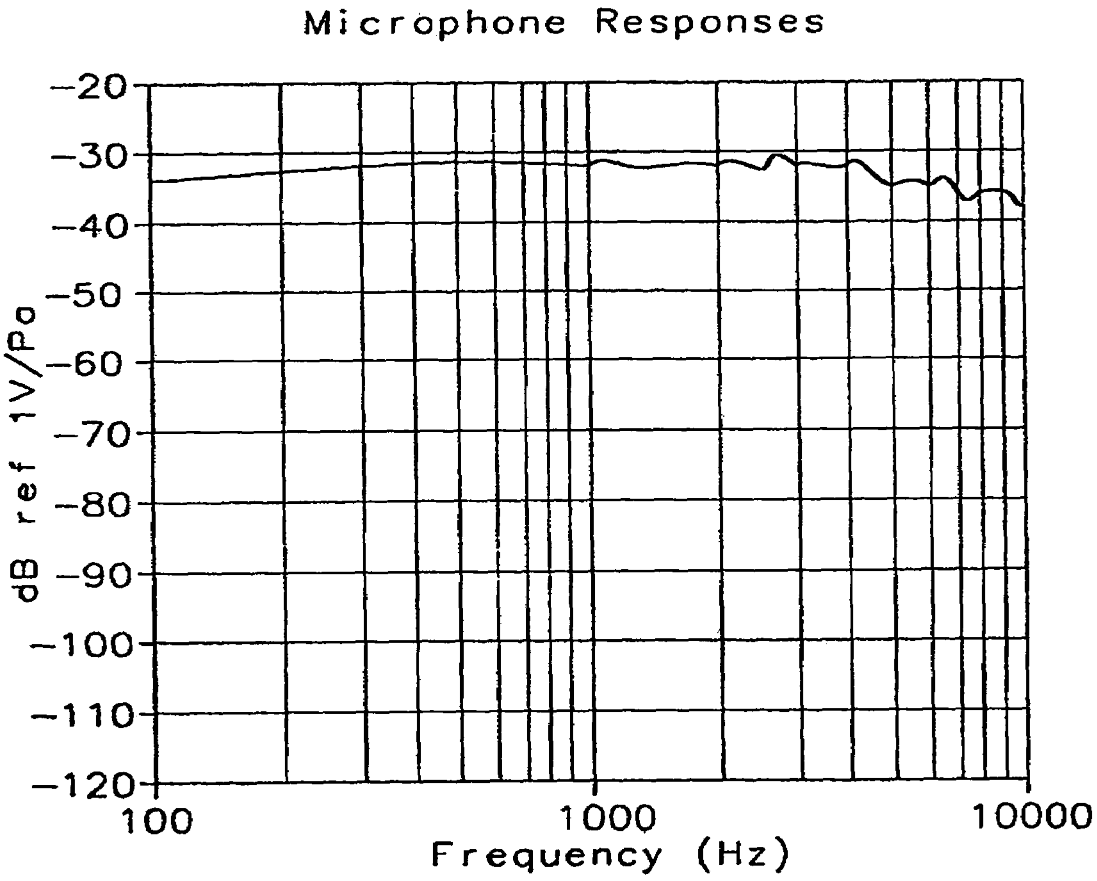
FIG. 25 graphically illustrates tested frequency responses for a microphone of the present invention.

FIG. 25 illustrates-tested frequency responses for a microphone fabricated according to the process of the present invention at a bias voltage of 8 volts showing a sensitivity of 25 mV/Pa. The test results shown in these graphs have proven that the invented microphone-design and fabrication method can produce the microphone with any desired high performance—higher sensitivity (>100 mV/Pa) in a narrow frequency range (<3 KHz) or lower sensitivity (>20 mV/Pa) in a wider frequency range (>10 KHz).

The microphone design and fabrication process of the present invention produces a high performance microphone with the highest sensitivity and lowest noise achieved. The microphone of the present invention includes a stress-free polysilicon diaphragm. The composite diaphragm design includes compressive buckling for anti-stiction. After release and drying, the compressive layers on the diaphragm are removed. The fabrication process is a planar process despite thick sacrificial layers. Via contacts are formed by polysilicon filling and self-doping.

While the invention has been particularly shown and described with reference to the preferred embodiments thereof, it will be understood by those skilled in the art that various changes in form and details may be made without departing from the spirit and scope of the invention.

What is claimed is:

1. A silicon condenser microphone comprising:

a perforated backplate comprising a portion of a single crystal silicon substrate;

a support structure formed on said single crystal silicon substrate surrounding said backplate comprising:

polysilicon filled trenches through an oxide layer surrounding said single crystal silicon perforated backplate;

nitride supporting struts surrounding said perforated backplate and lying in between said polysilicon filled trenches and said air gap and overlapping an edge of said floating diaphragm; and polysilicon endplates coupled to the nitride supporting struts and lying in between said polysilicon filled trenches and underlying and overlapping an edge of said diaphragm; and a floating silicon diaphragm supported on its edge by said support structure lying parallel to said perforated backplate and separated from said perforated backplate by an air gap.

2. The silicon condenser microphone of claim 1 further comprising a nitride layer overlying and overlapping the diaphragm.

3. The silicon condenser microphone of claim 1 wherein said polysilicon filled trench electrically couples a metallic bonding area to an N++ doped region below an oxide layer.

4. The silicon condenser microphone of claim 1 wherein an oxide layer substantially defines the thickness of the air gap.

5. The silicon condenser microphone of claim 4 wherein a layer comprising thermal oxide, nitride and tetraethoxysilane (TEOS) underlies the oxide layer.

6. The silicon condenser microphone of claim 1 wherein the perforated backplate thickness is approximately 10 micrometers.

7. The silicon condenser microphone of claim 1 wherein a thickness of the floating silicon diaphragm is about 2 micrometers to about 3 micrometers.

8. The silicon condenser microphone of claim 1 wherein the air gap is about 8 micrometers.

9. The silicon condenser microphone of claim 1 wherein a hole in the perforated backplate is about 20 micrometers to about 40 micrometers.

10. The silicon condenser microphone of claim 1 wherein the floating silicon diaphragm diameter is between 1000 micrometers and 2000 micrometers.

11. A silicon condenser microphone comprising:

a perforated backplate comprising a portion of a single crystal silicon substrate;

a support structure formed on said single crystal silicon substrate surrounding said backplate;

a floating silicon diaphragm supported on its edge by said support structure lying parallel to said perforated backplate and separated from said perforated backplate by an air gap, a thickness of the air gap substantially defined by an oxide layer; and a layer comprising thermal oxide, nitride and tetraethoxysilane (TEOS) underlies the oxide layer.

* * * * *

UNITED STATES PATENT AND TRADEMARK OFFICE

CERTIFICATE OF CORRECTION

PATENT NO. : 7,132,307 B2
APPLICATION NO. : 10/736377
DATED : November 7, 2006
INVENTOR(S) : Wang et al.

It is certified that error appears in the above-identified patent and that said Letters Patent is hereby corrected as shown below:

On the Title Page:

Line (73), “LLC.” should be -- LLC --.

Signed and Sealed this

Twentieth Day of March, 2007

JON W. DUDAS

*Director of the United States Patent and Trademark Office*